United States Patent
Yanagisawa et al.

(10) Patent No.: US 11,404,607 B2
(45) Date of Patent: Aug. 2, 2022

(54) DISPLAY APPARATUS, SOURCE SUBSTRATE STRUCTURE, DRIVING SUBSTRATE STRUCTURE, AND METHOD OF MANUFACTURING DISPLAY APPARATUS

(71) Applicant: SAMSUNG ELECTRONICS CO., LTD., Suwon-si (KR)

(72) Inventors: Satoshi Yanagisawa, Yokohama (JP); Takashi Takagi, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 16/854,460

(22) Filed: Apr. 21, 2020

(65) Prior Publication Data

US 2020/0381590 A1    Dec. 3, 2020

(30) Foreign Application Priority Data

May 28, 2019  (JP) .............................. JP2019-099645
Jan. 17, 2020  (KR) ........................ 10-2020-0006751

(51) Int. Cl.
| | |
|---|---|
| *H01L 33/40* | (2010.01) |
| *H01L 33/38* | (2010.01) |
| *H01L 33/62* | (2010.01) |
| *H01L 33/00* | (2010.01) |

(Continued)

(52) U.S. Cl.
CPC ............... *H01L 33/40* (2013.01); *G09G 3/32* (2013.01); *H01L 25/0753* (2013.01); *H01L 33/0093* (2020.05); *H01L 33/0095* (2013.01); *H01L 33/38* (2013.01); *H01L 33/62* (2013.01);

(Continued)

(58) Field of Classification Search
None
See application file for complete search history.

(56) References Cited

U.S. PATENT DOCUMENTS

| | | |
|---|---|---|
| 7,795,053 B2 | 9/2010 | Ohno et al. |
| 8,609,444 B2 | 12/2013 | Wada et al. |
| 9,425,173 B2 | 8/2016 | Rhee |

(Continued)

FOREIGN PATENT DOCUMENTS

| | | |
|---|---|---|
| EP | 3352217 A2 | 7/2018 |
| JP | 2002-118137 A | 4/2002 |

(Continued)

OTHER PUBLICATIONS

Communication issued Nov. 3, 2021 by the European Patent Office in European Patent Application No. 20814013.7.

(Continued)

*Primary Examiner* — Robert K Carpenter
(74) *Attorney, Agent, or Firm* — Sughrue Mion, PLLC

(57) ABSTRACT

A display apparatus, including a light-emitting device including a device-side electrode; a driving substrate configured to drive the light-emitting device; a driver-side electrode provided on the driving substrate; and a metal layer configured to connect the device-side electrode to the driver-side electrode, and including a first interface between the metal layer and the device-side electrode, and a second interface between the metal layer and the driver-side electrode, wherein at least one of the first interface and the second interface includes an intermetallic compound.

8 Claims, 28 Drawing Sheets

(51) Int. Cl.
*H01L 25/075* (2006.01)
*G09G 3/32* (2016.01)

(52) U.S. Cl.
CPC ............. *H01L 2933/0016* (2013.01); *H01L 2933/0066* (2013.01)

(56) References Cited

U.S. PATENT DOCUMENTS

| | | | |
|---|---|---|---|
| 10,020,293 B2 * | 7/2018 | Zou | ............ H01L 33/0095 |
| 10,263,153 B2 | 4/2019 | Zhang | |
| 10,304,810 B2 | 5/2019 | Gardner et al. | |
| 2016/0204313 A1 | 7/2016 | Namiki et al. | |
| 2016/0218289 A1 | 7/2016 | Lee et al. | |
| 2017/0236811 A1 | 8/2017 | Pokhriyal et al. | |
| 2017/0263593 A1 | 9/2017 | Zou et al. | |
| 2017/0301660 A1 | 10/2017 | Pokhriyal et al. | |
| 2018/0076369 A1 | 3/2018 | Cheng et al. | |
| 2018/0175262 A1 * | 6/2018 | Jansen | ............ H01L 25/167 |
| 2019/0081200 A1 | 3/2019 | Ting et al. | |

FOREIGN PATENT DOCUMENTS

| | | |
|---|---|---|
| JP | 4070795 B2 | 4/2008 |
| JP | 2013-1 A | 1/2013 |
| JP | 5549190 B2 | 7/2014 |
| JP | 2015-88744 A | 5/2015 |
| JP | 2016-143741 A | 8/2016 |
| JP | 2017-45832 A | 3/2017 |
| JP | 2018508971 A | 3/2018 |
| JP | 6744870 B2 | 8/2020 |
| KR | 1020170110547 A | 10/2017 |
| KR | 1020180075856 A | 7/2018 |
| WO | 2013162927 A1 | 10/2013 |
| WO | 2014/115798 A1 | 7/2014 |
| WO | 2017/033931 A1 | 3/2017 |

OTHER PUBLICATIONS

International Search Report (PCT/ISA/210) and Written Opinion (PCT/ISA/237) dated Jul. 14, 2020 issued by the International Searching Authority in International Application No. PCT/KR2020/005121.

* cited by examiner

DISPLAY APPARATUS, SOURCE SUBSTRATE STRUCTURE, DRIVING SUBSTRATE STRUCTURE, AND METHOD OF MANUFACTURING DISPLAY APPARATUS

CROSS-REFERENCE TO RELATED APPLICATIONS

This application is based on and claims priority under 35 U.S.C. § 119 to Japanese Patent Application No. 2019-099645, filed on May 28, 2019, in the Japanese Patent Office and Korean Patent Application No. 10-2020-0006751, filed on Jan. 17, 2020, in the Korean Intellectual Property Office, the disclosures of which are incorporated herein by reference in their entireties.

BACKGROUND

1. Field

The disclosure relates to a display apparatus, a source substrate structure, a driving substrate structure, and a method of manufacturing the display apparatus, and more particularly, to a display apparatus, a source substrate structure and a driving substrate structure used to manufacture the display apparatus, and a method of manufacturing the display apparatus.

2. Description of Related Art

Recently, display apparatuses using micro-light-emitting diodes (LEDs) that are light-emitting devices have been developed. Display apparatuses using micro LEDs may have a high response speed, may avoid burning, and may be capable of displaying high-luminance and high-precision images at low power.

A method of manufacturing a display apparatus using micro-LEDs is disclosed in, for example, Japanese Patent Publication No. 2018-508971. In this publication, stepped portions are formed on a backplane substrate that supplies power to a light-emitting device, and the light-emitting device is connected for each stepped portion. Accordingly, a stepped backplane substrate is first manufactured and a light-emitting device is connected for each stepped portion of the backplane substrate, and thus, a manufacturing method is complicated.

SUMMARY

Provided is a display apparatus capable of simply and reliably bonding a light-emitting device and a driving substrate for driving the light-emitting device.

Provided is a source substrate structure including a light-emitting device and capable of simply and reliably bonding the light-emitting device and a driving substrate.

Provided is a driving substrate structure configured to drive a light-emitting device and capable of simply and reliably bonding the light-emitting device and a driving substrate.

Also provided is a method of manufacturing a display apparatus which may simply and reliably bond a driving substrate for driving a light-emitting device.

Additional aspects will be set forth in part in the description which follows and, in part, will be apparent from the description, or may be learned by practice of the presented embodiments.

In accordance with an aspect of the disclosure, a display apparatus includes a light-emitting device including a device-side electrode; a driving substrate configured to drive the light-emitting device; a driver-side electrode provided on the driving substrate; and a metal layer configured to connect the device-side electrode to the driver-side electrode, and including a first interface between the metal layer and the device-side electrode, and a second interface between the metal layer and the driver-side electrode, wherein at least one of the first interface and the second interface includes an intermetallic compound.

Each of the device-side electrode and the driver-side electrode may include at least one of graphene, gold (Au), silver (Ag), copper (Cu), aluminum (Al), platinum (Pt), nickel (Ni), chromium (Cr), titanium (Ti), and indium tin oxide (ITO).

The metal layer may include at least one type of alloy from among a Sn—Ag—Cu alloy, a Sn—Bi alloy, a Sn—Bi—Ag alloy, and a Sn—Ag—Cu—Ni alloy.

The device-side electrode may have a rectangular shape, and wherein a length of a longest side of the device-side electrode may be equal to or less than 100 μm.

The device-side electrode may have a rectangular shape, and a thickness of the metal layer may be equal to or less than half of a length of a shortest side of the device-side electrode.

In accordance with an aspect of the disclosure, a source substrate structure used to manufacture a display apparatus includes a source substrate configured to transmit laser light of a predetermined wavelength; a plurality of light-emitting devices attached to the source substrate by a release layer including a resin material; a device-side electrode provided on each of the plurality of light-emitting devices; and a resin layer including one of a metal powder or a bump provided on the device-side electrode.

The device-side electrode may include at least one of graphene gold (Au), silver (Ag), copper (Cu), aluminum (Al), platinum (Pt), nickel (Ni), chromium (Cr), titanium (Ti), and indium tin oxide (ITO), and the bump may include at least one type of alloy from among a Sn—Ag—Cu alloy, a Sn—Bi alloy, a Sn—Bi—Ag alloy, and a Sn—Ag—Cu—Ni alloy.

The resin layer may include the bump, and an adhesive layer may be formed on the plurality of light-emitting devices.

A thickness of the adhesive layer may be equal to or less than 50 μm.

The bump may include at least one shape from among a dome shape, a circular cylindrical shape, an n-pyramidal shape, an n-angular cylindrical shape, semi-circular cylindrical shape, a semi-elliptical cylindrical shape, and a semi-m-angular cylindrical shape, wherein n is an integer equal to greater than 3, and m is an integer equal to or greater than 4.

The resin layer may include the metal powder, and the resin layer may have anisotropic conductivity.

In accordance with an aspect of the disclosure, a method of manufacturing a display apparatus includes forming a semiconductor layer to a sapphire substrate; forming a device-side electrode on the semiconductor layer; transferring the semiconductor layer to a relay substrate by adhering the relay substrate to a surface of the device-side electrode; removing the sapphire substrate from the semiconductor layer; forming a release layer including a resin material on a source substrate configured to transmit laser light of a predetermined wavelength; transferring the semiconductor layer formed on the relay substrate to the release layer; removing the relay substrate; forming a light-emitting device by dividing the semiconductor layer forming a bump on the device-side electrode; and emitting the laser light of the predetermined wavelength to the light-emitting device to separate the light-emitting device from the release layer and adhere the light-emitting device to a driving substrate.

The method may further include forming an adhesive layer on the driving substrate on which a driver-side electrode is formed.

The method may further include forming an adhesive layer on the light-emitting device including the device-side electrode and the bump.

The light-emitting device may be included in a plurality of light-emitting devices formed by the dividing, and the plurality of light-emitting devices may be attached to the source substrate by the release layer.

The light-emitting device may have a rectangular shape, a length of a longest side of the light-emitting device may be equal to or less than 100 μm, the light-emitting device may be included in a plurality of light-emitting devices formed by the dividing, and an arrangement pitch of the plurality of light-emitting devices on the source substrate may be equal to or less than 200 μm.

The light-emitting device may be included in a plurality of light-emitting devices formed by the dividing, a portion of the plurality of light-emitting devices may be adhered to the driving substrate according to a display panel size, an arrangement pitch of the portion of the plurality of light-emitting devices on the driving substrate may be at least 3 times larger than an arrangement pitch of the plurality of light-emitting devices on the source substrate.

Each of the device-side electrode and a driver-side electrode formed on the driving substrate may include at least one of graphene, gold (Au), silver (Ag), copper (Cu), aluminum (Al), platinum (Pt), nickel (Ni), chromium (Cr), titanium (Ti), and indium tin oxide (ITO).

A metal layer may be formed between the device-side electrode and a driver-side electrode formed on the driving substrate, and the metal layer may include at least one type of alloy from among a Sn—Ag—Cu alloy, a Sn—Bi alloy, a Sn—Bi—Ag alloy, a Sn—Bi—Ag alloy, and a Sn—Ag—Cu—Ni alloy.

BRIEF DESCRIPTION OF THE DRAWINGS

The above and other aspects, features, and advantages of certain embodiments of the disclosure will be more apparent from the following description taken in conjunction with the accompanying drawing in which.

DETAILED DESCRIPTION

Figure 1:
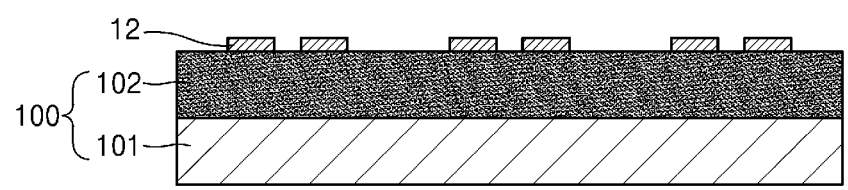
FIG. 1 is a cross-sectional view illustrating a micro-light-emitting diode (LED) forming process according to a method of manufacturing a display apparatus in Example Method 1.

The disclosure will now be described more fully with reference to the accompanying drawings in which embodiments are shown. The same reference numerals in the drawings denote the same elements, and sizes of elements in the drawings may be exaggerated for clarity and convenience of explanation. Also, embodiments are described, and various modifications may be made from the described embodiments.

Throughout the disclosure, the expression at least one of "a, b or c" indicates only a, only b, only c, both a and b, both a and c, both b and c, all of a, b, and c, or variations thereof.

It will also be understood that when an element is referred to as being "on" another element, it may be directly on the other element, or intervening elements may be present therebetween.

As used herein, the singular forms "a," "an," and "the" are intended to include the plural forms as well, unless the context clearly indicates otherwise. It will be further understood that the terms "comprises" and/or "comprising" used herein specify the presence of stated components, but do not preclude the presence or addition of one or more other components.

The use of the terms "a" and "an," and "the" and similar referents in the context of describing the disclosure is to be construed to cover both the singular and the plural.

The steps of all methods described herein may be performed in any suitable order unless otherwise indicated herein or otherwise clearly contradicted by context. The disclosure is not limited to the described order of the steps. The use of any and all examples, or exemplary language (e.g., "such as") provided herein, is intended merely to better illuminate the disclosure and does not pose a limitation on the scope of the disclosure unless otherwise claimed.

Example Method 1

A method of manufacturing a display apparatus according to Example Method 1 will be described.

FIGS. 1 through 7 are cross-sectional views illustrating a micro-light-emitting diode (micro-LED) forming process according to a method of manufacturing a display apparatus.

In the micro-LED forming process according to the method of manufacturing the display apparatus, as shown in FIG. 1, a semiconductor layer 102 that is to become micro-LEDs, which may be referred to as a light-emitting device, is formed on a substrate 101. The substrate 101 may be, for example, a sapphire substrate. The semiconductor layer 102 may emit light of a certain wavelength as an LED. The semiconductor layer 102 may include a GaN-based semiconductor or the like grown on the substrate 101. In this step, the semiconductor layer 102 is not divided into individual micro-LEDs. In embodiments, the substrate 101 and the semiconductor layer 102 are collectively referred to as an initial substrate 100.

The substrate 101 may have, for example, a 4-inch wafer size.

An electrode may be further formed at a position corresponding to each micro-LED after division on the semiconductor layer 102. In embodiments, the electrode is referred to as a light-emitting device-side electrode 12 or device-side electrode 12. Division into micro-LEDs will be described below.

The device-side electrode 12 is formed at a position corresponding to each micro-LED after division on the semiconductor layer 102. A part of a metal wiring electrically connected to the semiconductor layer 102 may be used as the device-side electrode 12, or a metal pad directly contacting the semiconductor layer 102 may be formed as the device-side electrode 12.

The device-side electrode 12 may be formed by using at least one of graphene or at least one type, of metal selected from a group including, for example, gold (Au), silver (Ag), copper (Cu), aluminum (Al), platinum (Pt), nickel (Ni), chromium (Cr), titanium (Ti), and indium tin oxide (ITO). For example, the device-side electrode 12 may include at least one of Au, Ag, or Cu. The metal may be used to form an intermetallic compound with a solder alloy which will be described below.

Figure 2:
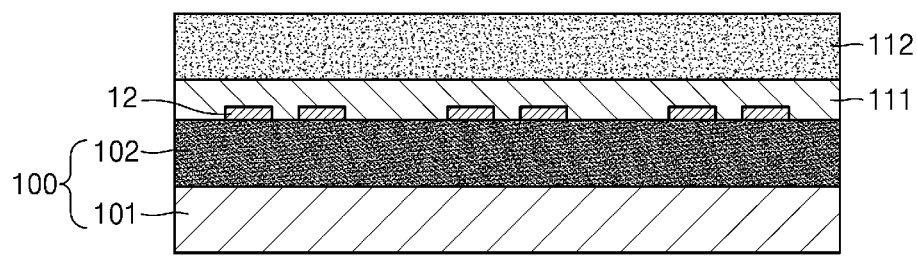
FIG. 2 is a cross-sectional view illustrating a micro-LED forming process according to a method of manufacturing a display apparatus, according to an embodiment.

Next, as shown in FIG. 2, a relay substrate 112 is bonded by a transfer resin layer 111 to a surface of the initial substrate 100 on which the device-side electrode 12 is formed. This process is performed, for example, as follows. First, the transfer resin layer 111 is formed by using spin coating or the like on a surface of the relay substrate 112 facing the initial substrate 100. Next, the initial substrate 100 and the relay substrate 112 may be bonded to each other. Next, the transfer resin layer 111 may be cured, by heat treatment, and thus the initial substrate 100 and the relay substrate 112 may be fixed.

For example, a quartz glass substrate may be used as the relay substrate 112. The transfer resin layer 111 may include a resin material such as polyimide resin, acrylic resin, for example polymethyl methacrylate (PMMA), epoxy resin, polypropylene (PP) resin, polycarbonate resin, or acrylonitrile butadiene styrene (ABS) resin, In the transfer resin layer 111, thermal curing agent is mixed with the resin material. Also, any other thermosetting resins may be used as the transfer resin layer 111. The transfer resin layer 111 may include a material whose absorbance in a wavelength of laser light used in laser lift-off described below is equal to or greater than 80%.

Figure 3:
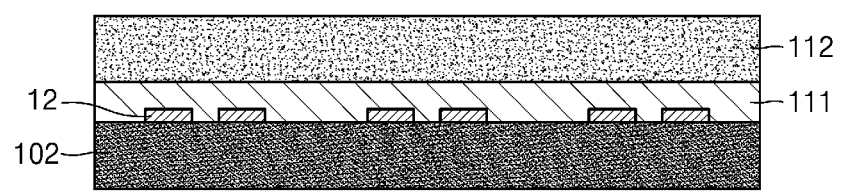
FIG. 3 is a cross-sectional view illustrating a micro-LED fanning process according to a method of manufacturing a display apparatus, according to an embodiment.

As shown in FIG. 3, the substrate 101 may be separated from the semiconductor layer 102. The substrate 101 may be separated by using, for example, laser lift-off. For example, laser light of an ultraviolet wavelength is emitted from the substrate 101 to scan an entire surface of the substrate 101. Due to the emission of the laser light, the substrate 101 may be separated from the semiconductor layer 102. For example, KrF excimer laser having a wavelength of 248 nm may be used as the laser light. However, the used wavelength is not limited thereto, and may be any wavelength as long as the substrate 101 may be separated from the semiconductor layer 102.

Figure 4:
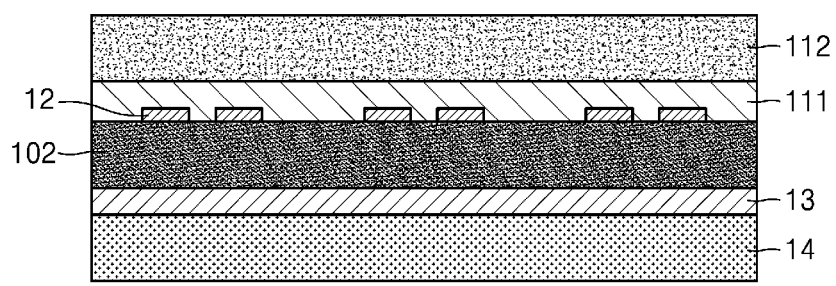
FIG. 4 is a cross-sectional view strafing a micro-LED forming process according to a method of manufacturing a display apparatus, according to an embodiment.

As shown in FIG. 4, a source substrate 14 is bonded through a release layer 13 to the semiconductor layer 102. The release layer 13 may be a dynamic release layer (DRL). For example, this process is performed as follows. First, a resin material that is to become the release layer 13 may be formed on the semiconductor layer 102 by using spin coating or the like. Next, the source substrate 14 may be bonded to the resin material. The resin material is cured by heat treatment to become the release layer 13, and the source substrate 14 may be fixed.

The source substrate 14 transmits laser light having a wavelength used in a laser ablation process described below. For example, a quartz glass substrate may be used as the source substrate 14. The quartz glass substrate may have a size that is equal to or greater than that of the substrate 101. For example, when the quartz glass substrate has a 4-inch wafer size, the source substrate 14, which may be the quartz glass substrate, may also have a 4-inch wafer size. A size of the source substrate 14 will be described below.

Examples of the resin material that becomes the release layer 13 may include polyimide resin, acrylic resin for example PMMA, epoxy resin, PP resin, polycarbonate resin, and ABS resin, and the resin material is mixed with a thermal curing agent. Any of other thermosetting resins may be used as the resin material. The resin material that becomes the release layer 13 may include a material whose absorbance in a certain wavelength of laser light used in a laser ablation process is, equal to or greater than 80%. When the resin material having the absorbance is used, a micro-LED may be easily separated in the laser ablation process.

In an embodiment, a thickness of the release layer 13 may be adjusted during application of the resin material to be equal to or greater than 0.1 μm and equal to or less than 2 μm after curing.

Figure 5:
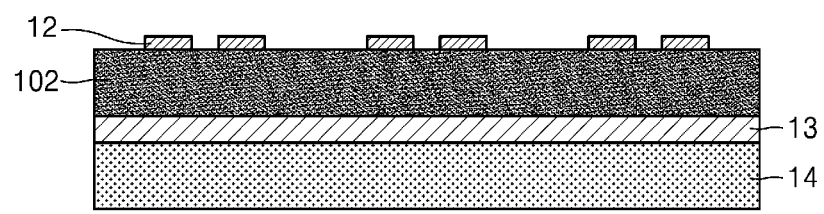
FIG. 5 is a cross-sectional view illustrating a micro-LED forming process according to a method of manufacturing a display apparatus, according to an embodiment.

As shown in FIG. 5, the relay substrate 112 is removed. The relay substrate 112 may be removed by using, for example, laser lift-off. The relay substrate 112 is removed, for example, as follows. Laser light of an ultraviolet wavelength is emitted from the relay substrate 112 to scan an entire surface of the relay substrate 112. Accordingly, due to the emission of the laser light, the transfer resin layer 111 is dissolved, and the relay substrate 112 is separated and removed from a surface of the device-side electrode 12. A portion of the transfer resin layer 111 remaining on the surface of the device-side electrode 12 is removed by using cleaning. For example, KrF excimer laser having a wavelength of 248 nm is used as the laser light. However, the used wavelength is not limited thereto, and may be appropriately determined according to a resin material used for the transfer resin layer 111.

Figure 6:
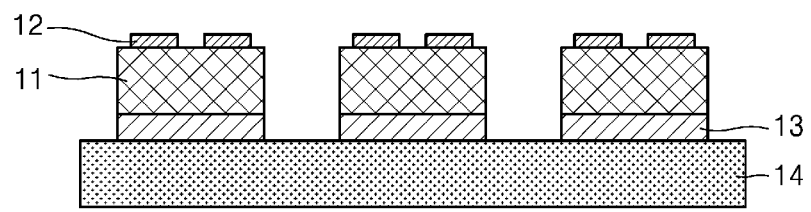
FIG. 6 is a cross-sectional view illustrating a micro-LED forming process according to a method of manufacturing a display apparatus, according to an embodiment.

As shown in FIG. 6, the semiconductor layer 102 may be divided into a plurality of micro-LEDs 11. In detail, for example, a photoresist may be formed on the semiconductor layer 102 and may be patterned by using photolithography, and the semiconductor layer 102 may be divided into the micro-LEDs 11 through dry etching by using the patterned photoresist as a mask. In this step, the release layer 13 may also be patterned to have the same shape as the micro-LEDs 11 by using the micro-LEDs 11 as a mask. The dry etching process used may be reactive-ion etching (RIE). A chip shape of each of the micro-LED 11 on which the device-side electrode 12 is formed may be a rectangular shape in a plan view. A length of a longest side from among sides of the rectangular shape of the micro-LED 11 may be equal to or less than, for example, 100 μm. Also, a height of the micro-LED 11 that is, a thickness of the semiconductor layer 102, may be equal to or less than, for example, 500 μm. Accordingly, the dimensions of the micro-LED 11 may be length×width×height=100 μm or less×100 μm or less×500 μm or less. Also, lower limits of the length, the width, and the height are not particularly limited, and may be any values as long as the micro-LED 11 may be manufactured.

Also, when the micro-LEDs 11 arranged on the source substrate 14 are clearly separated from one another, a gap or interval between the micro-LEDs 11 may be any minimum value as long as the micro-LEDs 11 may be manufactured. Accordingly, an arrangement pitch depends on a size of each micro-LED 11, but may be equal to or less than, for example, 200 μm. The arrangement pitch may be, for example, distance between the centers of adjacent micro-LEDs 11 or a distance between edges of adjacent micro-LEDs 11 in the same direction.

Figure 7:
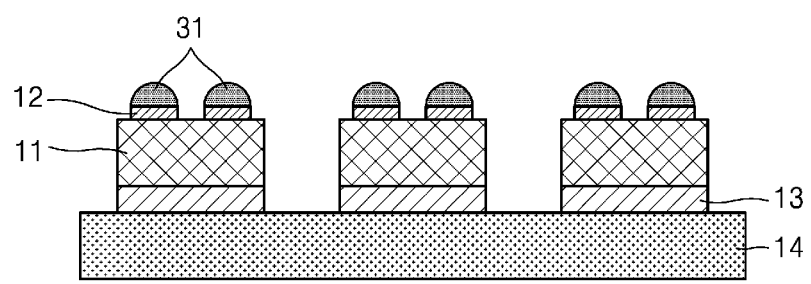
FIG. 7 is a cross-sectional view illustrating a micro-LED forming process according to a method of manufacturing a display apparatus, according to an embodiment.

In Example Method 1, as shown in FIG. 7 a bump 31 may be formed on each device-side electrode 12. The bump 31 may be formed by using any desired method, for example, a ball bump method, a solder paste method a press method, or a plating method. Also, self-assembly anisotropic conductive paste (SAP) that is anisotropic conductive paste may be used.

A method for forming the bump 31 may include at least one type of alloy selected from the group including, for example, a Sn—Ag—Cu alloy, a Sn—Bi alloy, a Sn—Bi—Ag alloy, arid a Sn—Ag—Cu—Ni alloy. The alloys may form an intermetallic compound with a metal of the device-side electrode 12 and a metal of a driving substrate-side electrode, which may also be referred to as a driver-side electrode, and which will be described below. A solder alloy that is commercially available may be used as such an alloy. A composition of a commercially available solder alloy from a solder maker is disclosed in, for example, "EGO Solder Alloy and Form" in the homepage of Senju Metal Industry Co., Ltd. (URL=https://jp.senju.com/ja/products/ecosolder/alloy_form/). The composition of the solder alloy extracted from the homepage is shown in Table 1 and Table 2.

TABLE 1

| | Melting Temperature (° C.) | | |
|---|---|---|---|
| Alloy Temperature | Solidus Line | Peak Temperature | Liquidus Line |
| Sn—3.0Ag—0.5Cu | 217 | 219 | 220 |
| Sn—3.5Ag | 221 | 223 | 223 |
| Sn—3.5Ag—0.75Cu | 217 | 219 | 219 |
| Sn—3.8Ag—0.7Cu | 217 | 219 | 220 |
| Sn—3.9Ag—0.6Cu | 217 | 219 | 226 |
| Sn—4.0Ag—0.5Cu | 217 | 219 | 229 |
| Sn—1.0Ag—0.5Cu | 217 | 219 | 227 |
| Sn—1.0Ag—0.7Cu | 217 | 219 | 224 |
| Sn—0.3Ag—0.7Cu | 217 | 219 | 227 |
| Sn—0.75Cu | 227 | 229 | 229 |
| Sn—0.7Cu—Ni—P—Ge | 228 | 230 | 230 |
| Sn—0.6Cu—Ni—P—Ge | 227 | 228 | 228 |
| Sn—0.3Bi—0.7Cu—P | 225 | 229 | 229 |
| Sn—1.0Ag—0.7Cu—Bi—In | 211 | 222 | 222 |
| Sn—0.3Ag—0.7Cu—0.5Bi—Ni | 216 | 228 | 228 |
| Sn—0.7Cu—0.5Bi—Ni | 225 | 229 | 229 |
| Sn—3.4Ag—0.7Cu—Bi—Sb—Ni—x | 210 | 221 | 221 |
| Sn—3.9Ag—0.6Cu—3.0Sb | 221 | 224 | 226 |
| Sn—3.5Ag—0.5Bi—8.0In | 196 | 208 | 214 |
| Sn—5.0Sb | 240 | 243 | 243 |
| Sn—10Sb | 245 | 248 | 266 |
| Sn—0.5Ag—6.0Cu | 217 | 226 | 378 |
| Sn—5.0Cu—0.15Ni—x | 228 | 229 | 365 |

TABLE 2

| | Melting Temperature (° C.) | | |
|---|---|---|---|
| Alloy Temperature (wt %) | Solidus Line | Peak Temperature | Liquidus Line |
| Sn—0.5Ag—4.0Cu | 217 | 226 | 344 |
| Sn—2.3Ag—Ni—Co | 221 | 222 | 225 |
| Sn—2.0Ag—Cu—Ni | 218 | 220 | 224 |
| Sn—3.0Ag—0.8Cu—Bi—Ni | 205 | 215 | 215 |
| Sn—3.5Ag—0.8Cu—Bi—Ni | 203 | 214 | 215 |
| Sn—3.5Ag—0.8Cu—Bi—Ni | 214 | 219 | 219 |
| Sn—0.7Cu—Ni—P | 228 | 230 | 230 |
| Sn—0.75Cu—1.5Bi—Ni—x | 224 | 229 | 229 |
| Sn—3.0Ag—0.5Co—x | 219 | 221 | 221 |
| Sn—0.75Cu—x | 227 | 229 | 229 |
| Sn—0.3Ag—0.7Cu—x | 217 | 219 | 227 |
| Sn—58Bi | 139 | 141 | 141 |
| Sn—58Bi—Sb—Ni | 140 | 145 | 145. |

In Table 1 and Table 2, a solidus line indicates a temperature line at which a solid material starts to melt, and a liquidus line indicates a temperature line at which a liquid material starts to solidify.

Figure 8A:
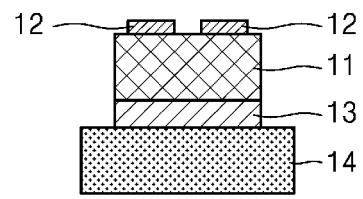
FIG. 8A is a cross-sectional view for describing a method of forming a bump by using anisotropic conductive paste (SAP), according to an embodiment.
Figure 8B:
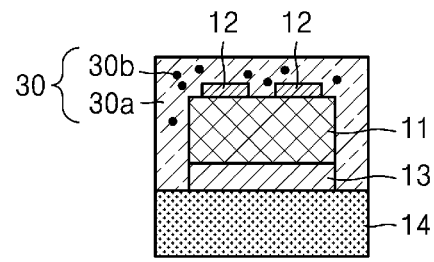
FIG. 8B is a cross-sectional view for describing a method of forming a bump by using SAP, according to an embodiment.
Figure 8C:
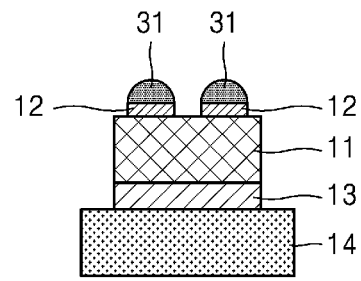
FIG. 8C is a cross-sectional view for describing a method of forming a bump by using SAP, according to an embodiment.

A method using SAP to form a bump will be described. FIGS. 8A through 8C are cross-sectional views for describing a method of forming a bump by using SAP. FIGS. 8A through 8C illustrate one micro-LED 11.

In order to form the bump 31 by using SAP 30, first, as shown in FIG. 8A, the micro-LED 11 provided after division on the source substrate 14 is prepared. This has already been described as a process up to FIG. 6.

Next, as shown in FIG. 8B, the SAP 30 may be applied to a surface on which the device-side electrode 12 is located. The SAP 30 includes a thermosetting resin 30a and metal powder 30b such as solder mixed into the thermosetting resin 30a. A shape of the metal powder 30b is not limited, and may be any shape such as a particulate shape or a plate shape. The same metal as the solder alloy may be used for the metal powder 30b of the SAP 30.

Next, the entire source substrate 14 on which the micro-LED 11 is formed may be heated. A heating temperature may be, for example, 160° C. However, the disclosure is not limited thereto. Due to the heating, the metal powder 30b may aggregate on a metal surface of the device-side electrode 12. A resin component in the SAP 30 is dissolved and removed. Accordingly, as shown in FIG. 8C, the metal powder 30b aggregating on the metal surface of the device-side electrode 12 may become the bump 31.

Figure 9A:
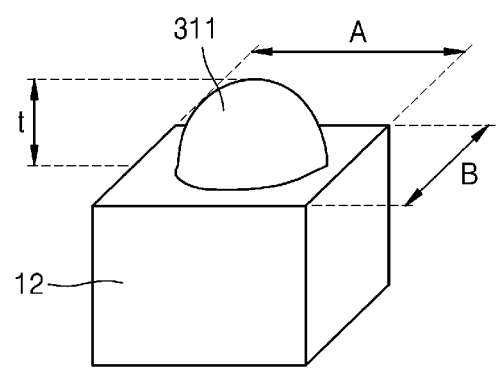
FIG. 9A is a perspective view illustrating a shape of a bump, according to an embodiment.
Figure 9B:
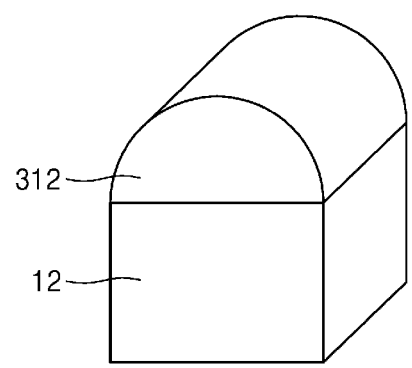
FIG. 9B is a perspective view illustrating a shape of a bump, according to an embodiment.
Figure 9C:
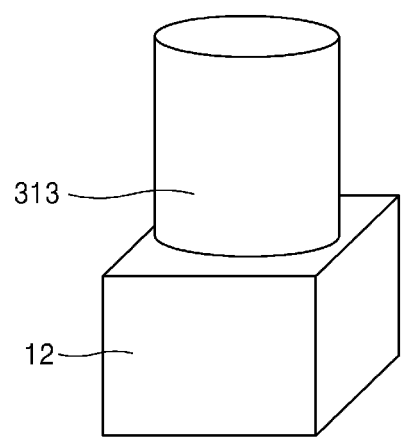
FIG. 9C is a perspective view illustrating a shape of a bump, according to an embodiment.
Figure 9D:
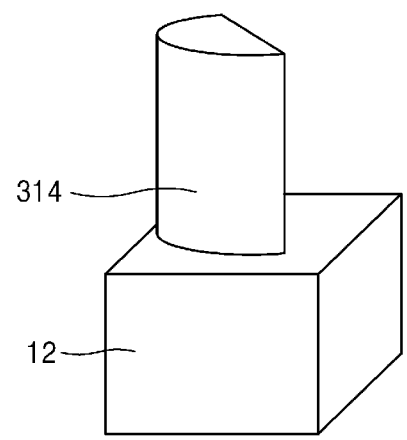
FIG. 9D is a perspective view illustrating a shape of a bump, according to an embodiment.
Figure 9E:
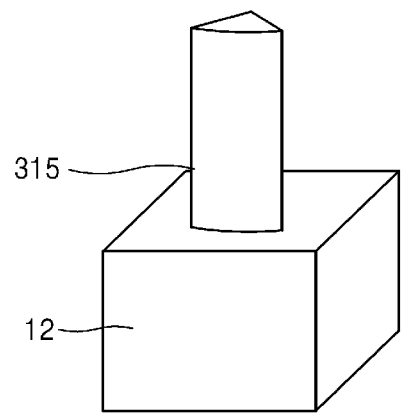
FIG. 9E is a perspective view illustrating a shape of a bump, according to an embodiment.
Figure 9F:
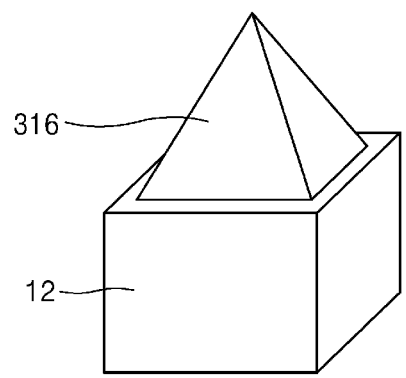
FIG. 9F is a perspective view illustrating a shape of a bump, according to an embodiment.
Figure 9G:
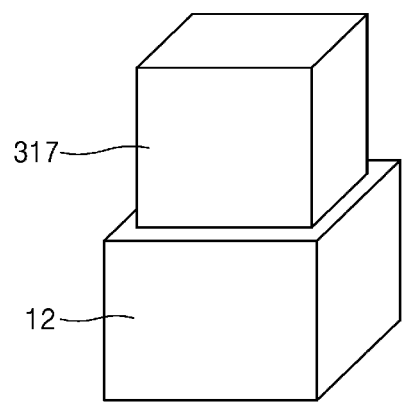
FIG. 9G is a perspective view illustrating a shape of a bump, according to an embodiment.
Figure 9H:
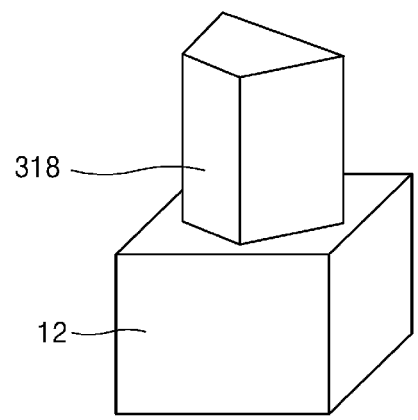
FIG. 9H is a perspective view illustrating a shape of a bump, according to an embodiment.
Figure 9I:
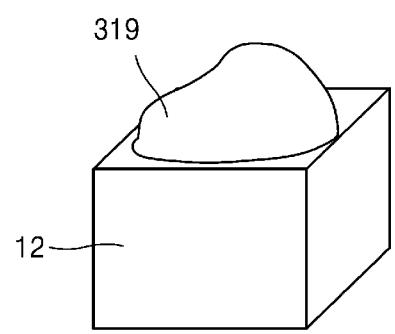
FIG. 9I is a perspective view illustrating a shape of a bump, according to an embodiment.

FIGS. 9A through 9I are perspective views illustrating a shape of the bump 31. For example, as shown in FIG. 9A, the bump 31 may have a dome shape 311. As shown in FIG. 9B, the bump 31 may have an arch shape 312. As shown in FIG. 9C, the bump 31 may have circular cylindrical shape 313. As shown in FIG. 9D, the bump 31 may have a semi-circular cylindrical shape 314. As shown in FIG. 9E, the bump 31 may have a semi-elliptical cylindrical shape 315. As shown in FIG. 9F, the bump 31 may have an n-pyramidal shape 316, where n is an integer equal to or greater than 3. For example, as illustrated in FIG. 9F, n=4. As shown in FIG. 9G, the bump 31 may have an n-angular cylindrical shape 317, where n is an integer equal to or greater than 3. For example, as illustrated in FIG. 9G and n=4. As shown in FIG. 9H, the bump 31 may have a semi-m-angular cylindrical shape 318, where the term 'semi-m angular cylindrical shape' may refer to a shape having at least one side whose length is different from others, and m is an integer equal to or greater than 4. As shown in FIG. 9I, the bump 31 may have an irregular shape 319.

An area of the bump 31 is not limited by its shape, and an area of a bottom surface of the bump 31 may be less than an area of the device-side electrode 12 as shown in FIG. 9A or may be almost the same as an area of the device-side electrode 12 as shown in FIG. 9B.

A size of the bump 31 may vary according to an area of the device-side electrode 12 and a drive side electrode which will be described below. In a finished product of a display apparatus described below, the bump 31 may be a metal layer that connects the device-side electrode 12 and the driver-side electrode. Accordingly, a size of the bump 31 determines a thickness of the metal layer. Accordingly, in the finished product of the display apparatus, a thickness of the metal layer is defined as follows. Referring to FIG. 9A, when a length of a short side of the device-side electrode 12 is A and a length of a long side of the device-side electrode 12 is B (A=B is possible), an area of the device-side electrode 12 is S=A×B. When the display apparatus is completed, a thickness T of the metal layer may be equal to or less than half of the length A of the short side. Because the metal layer has a thickness in this range, when the device-side electrode 12 and the driver-side electrode are connected to each other, a metal may be prevented from overflowing around and contacting other wirings or pads. Accordingly, a size of the bump 31 may be designed in consideration of the thickness T of the metal layer when the display apparatus is completed. For example, when the device-side electrode 12 has a square shape having a side equal to or greater than 5 μm and equal to or less than 10 μm, a height t of the bump 31 may be equal to or greater than 2 μm and equal to or less than 20 μm. A size of the bump 31 is not limited, and may appropriately vary according to a size of the device-side electrode 12, a shape of the bump 31, and the like. Also, the height t of the bump 31 may indicate a distance from a surface of the device-side electrode to a highest portion of the bump 31, as shown in FIG. 9A. Although not shown in FIGS. 9B through 9I, the height t of the bump 31 may also apply to the bump 31 of each of FIGS. 9B through 9I.

In Example Method 1, in the process so far, a source substrate structure in which the micro-LED 11 is held to the source substrate 14 by the release layer 13 may be provided.

Figure 10:
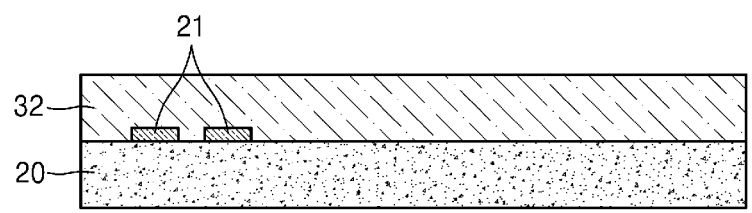
FIG. 10 is a cross-sectional view illustrating a driving substrate according to a method of manufacturing a display apparatus, according to an embodiment.

A driving substrate will now be described FIG. 10 is a cross-sectional view illustrating a driving substrate according to a method of manufacturing a display apparatus.

A driving substrate 20 may have a size corresponding to a size of the manufactured display apparatus. A size of the driving substrate 20 will be described below.

The driving substrate 20 may include an electrode to be connected to the device-side electrode 12, along with a thin-film transistor (TFT) or a wiring needed to supply power to the micro-LED 11. In embodiments, an electrode provided on the driving substrate 20 may be referred to as a driving substrate-side electrode 21 or a driver-side electrode 21. A part of a metal wiring formed on the driving substrate 20 may be used as the driver-side electrode 21, or a metal pad connected to a wiring may be formed as the driver-side electrode 21. The same metal as that of the device-side electrode 12 may be used for the driver-side electrode 21.

In Example Method 1, an adhesive layer 32 may be formed on a surface of the driving substrate 20 on which the driver-side electrode 21 is formed. For example, a non-conductive adhesive such as non-conductive film (NCF), non-conductive paste (NCP), or non-conductive adhesive (NCA) may be used for the adhesive layer 32. Also, a mixture of a thermal curing agent with, for example, epoxy resin, acrylic resin, polyimide resin, polyacrylamide resin, polyvinyl alcohol, or polyvinylpyrrolidone may be used for the adhesive layer 32. The adhesive layer 32 is not limited thereto, and a thermosetting resin may be used for the adhesive layer 32. Also, a photoresist, for example a positive photoresist, may be used for the adhesive layer 32.

The adhesive layer 32 may be applied to an entire surface of the driving substrate 20 on which the driver-side electrode 21 is formed by using, for example, a laminating method or a printing method. For example a thickness of the adhesive layer 32 may have a range equal to or greater than 1 μm and equal to or less than 50 μm. In order to connect the micro-LED 11 and the driving substrate 20 which will be described below, a pressing and heating process may be used. In Example Method 1, because a thickness of the adhesive layer 32 has a range equal to or greater than 1 μm and equal to or less than 50 μm, the bump 31 formed on the device-side electrode 12 may reach the driver-side electrode 21 in the pressing and heating process.

In Example Method 1, in the process so far, a driving substrate structure on which the adhesive layer 32 exists may be provided.

Figure 11:
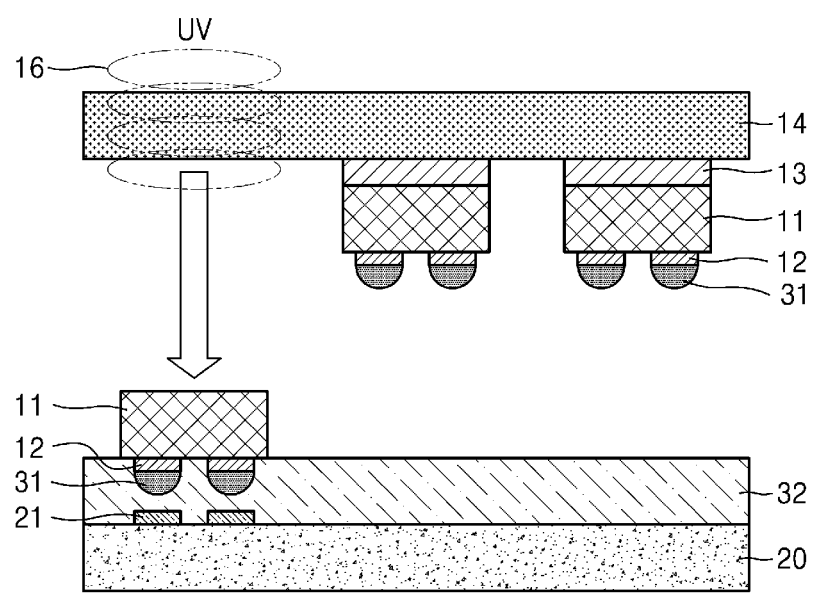
FIG. 11 is a cross-sectional view for describing a method of connecting a micro-LED and a driving substrate according to a method of manufacturing a display apparatus according to an embodiment.
Figure 12:
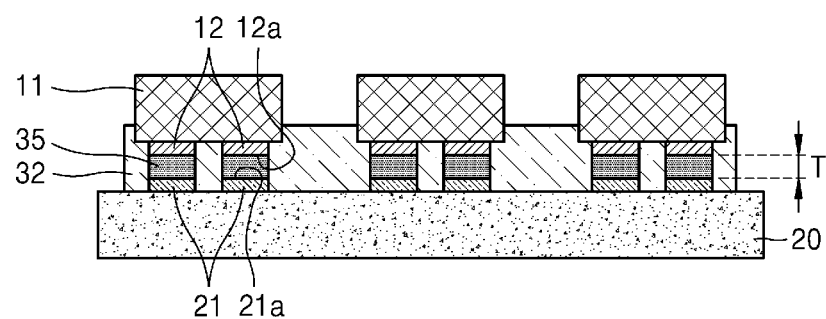
FIG. 12 is a cross-sectional view for describing a method of connecting a micro-LED and a driving substrate according to a method of manufacturing a display apparatus, according to an embodiment.

Connection between the micro-LED 11 and the driving substrate 20 will now be described. FIGS. 11 and 12 are cross-sectional views for describing a method of connecting the micro-LED 11 and the driving substrate 20 according to a method of manufacturing a display apparatus.

The micro-LED 11 and the driving substrate 20 are connected by using laser ablation. As shown in FIG. 11, first, a position of the source substrate 14 at which one micro-LED 11 is to be connected to the driving substrate 20 may be determined. In this case, a position at which a device-side pad of the one micro-LED 11 is connectable to the corresponding driver-side electrode 21 for driving the one micro-LED 11 may be determined as the position.

After the position is determined, laser light 16 having a certain wavelength, for example a UV wavelength, is emitted to the one micro-LED 11 from the source substrate 14. Due to the emission of the laser light 16, the release layer 13 that adheres the one micro-LED 11 to the source substrate 14 may be dissolved and the one micro-LED 11 may be released to the driving substrate 20. The released micro-LED 11 is caught by the adhesive layer 32 on the driving substrate 20. For example, KrF excimer laser having a wavelength of 248 nm may be used as the laser light 16. Alternatively, YAG(FHG) laser having a wavelength of 266 nm or YAG (THG) laser having a wavelength of 355 nm may be used. In particular, laser having a wavelength of 355 nm may be used for a glass substrate instead of a quartz glass substrate, and may have different member and device costs. Laser light of other wavelengths may also be used.

A beam diameter of the laser light 16 may be equal to or greater than a chip size of the one micro-LED 11. However, in embodiments a beam diameter of the laser light 16 may be a size that does not affect an adjacent micro-LED 11 on the source substrate 14. Because the user light 16 has such a beam diameter, the micro-LEDs 11 that are parallel on the source substrate 14 may be selectively transferred one by one to the driving substrate 20.

One beam of the laser light 16 may be emitted, or a plurality of beams may be simultaneously emitted at desired pitches by using a mask or the like or preparing a plurality of laser light sources. In the latter case, multiple micro-LEDs 11 may be simultaneously transferred.

Also, a gap between the driving substrate 20 and the micro-LED 11 when a laser ablation process is performed may have a range equal to or greater than 1 μm and equal to or less than 200 μm. Because the gap is equal to or greater than 1 μm and equal to or less than 200 μm, the micro-LED 11 separated by the laser ablation process may be caught by the driving substrate 20 at a target position.

Next, when a required number of micro-LEDs 11 are located on the driving substrate 20, the micro-LEDs 11 are pressed onto the driving substrate 20, closely attached, and simultaneously heated. Due to a pressing force in this case, the device-side electrode 12 and the driver-side electrode 21 are connected to each other by the bump 31. A heating temperature may be a temperature at which the bump 31 is dissolved. When the bump 31 is formed by using ECO solder that is a product of Senju Metal Industry Co., Ltd., a same temperature as a solder reflow temperature is used as the heating temperature. According to the homepage of Senju Metal Industry Co., Ltd., a melting temperature of the ECO solder varies according to a composition and is equal to or higher than 139° C. and equal to or lower than 245° C. Accordingly, the heating temperature in the pressing and heating process is set according to a used solder alloy, for example ECO solder.

The heating temperature may be a temperature at which the adhesive layer 32 is cured. For example, although the adhesive layer 32 depends on a pressing force when NCF, NCP, or NCA including a thermosetting resin is used, when a pressure is equal to or greater than 1 MPa and equal to or less than 10 MPa, a curing temperature may be equal to or higher than 100° C. and equal to or lower than 200° C. This temperature range overlaps a range of the above-described solder reflow temperature. Accordingly, a temperature in the pressing and heating process may be appropriately determined according to characteristics of a curing temperature of a resin material of the adhesive layer 32 and a composition of a solder alloy of the bump 31.

Accordingly, as shown in FIG. 12, a display apparatus 10 is completed. In the completed display apparatus 10, the device-side electrode 12 and the driver-side electrode 21 are connected to each other when the bump 31 becomes a metal layer 35, the metal layer 35 is an intermetallic compound formed of a metal of the bump 31 and a metal of each electrode. The thickness T of the metal layer 35 has already been described.

The intermetallic compound is a compound formed of two or more types of metals. The intermetailic compound is a type of alloy. A general alloy has a solid solution structure in which a structure of an original metal is maintained and atoms of another metal are randomly substituted. A general alloy is referred to as a solid solution alloy. A solid solution alloy may be formed to have various composition ratios to some extent although constituent metals are the same. An intermetallic compound is a compound having a crystal structure different from that of an original metal. A composition ratio of an intermetallic compound may be a simple integer ratio, for example 1:2 or 1:3, of two or more types of metals.

Such an intermetallic compound may be formed when a metal of the bump 31 is bonded to a metal of each of the device-side electrode 12 and the driver-side electrode 21. Accordingly, the intermetallic compound may be formed at a position including at least one of an interface 12a between the device-side electrode 12 and the metal layer 35 or an interface 21a between the driver-side electrode 21 and the metal layer 35.

A process of connecting the micro-LED 11 and the driving substrate 20 and then connecting or wiring a necessary peripheral circuit is performed as a method of manufacturing the display apparatus 10.

Example Method 1 may have the following effects.

In Example Method 1, in the completed display apparatus 10, the micro-LED 11 is connected by the metal layer 35 and a thin film of the adhesive layer 32 to the driving substrate 20 that is flat. Accordingly, in Example Method 1, because the driving substrate 20 or the source substrate 14 onto which the micro-LED 11 is held has no stepped portion other than a device structure or an electrode, the micro-LED 11 and the driving substrate 20 may be easily and reliably connected to each other when compared to related art methods. Also, in Example Method 1, because the driving substrate 20 and the micro-LED 11 are connected to each other by a two-layer structure including the metal layer 35 and the adhesive layer 32, the driving substrate 20 and the micro-LED 11 may be firmly connected to each other.

Also, in Example Method 1, because the micro-LED 11 and the driving substrate 20 are connected to each other by the metal layer 35 formed an intermetallic compound, electrical conductivity is high.

Also, in Example Method 1, the bump 31 is formed on the device-side electrode 12 in a state where the micro-LED 11 is held onto the source substrate 14. The source substrate 14 onto which the micro-LED 11 is held may have a wafer size. The driving substrate 20 may have a display size.

A size difference between the source substrate 14 and the driving substrate 20 will be described by using specific examples. Table 3 and Table 4 show arrangement pitches and sizes of the source substrate 14 and the driving substrate 20, and a ratio between the source substrate 14 and the driving substrate 20 for each panel size according to, various embodiments. Table 3 is for an embodiment including a 32-inch panel, Table 4 is for an embodiment including a 88-inch panel, and Table 5 is for an embodiment including a 100-inch panel. In these embodiments, a chip size of the micro-LED 11 is 40 µm×40 µm, a resolution of a display panel is 4K, and the number of pixels is 3,840×2,160.

TABLE 3

| | Source Substrate | Driving Substrate | Ratio |
|---|---|---|---|
| LED Arrangement Pitch | 51 µm | 184 µm | 3.6 times |
| Application Area at One Time | 70 mm × 70 mm *4-inch wafer | 707.1 mm × 398.3 mm For 32-inch panel | About 57 times |

TABLE 4

| | Source Substrate | Driving Substrate | Ratio |
|---|---|---|---|
| LED Arrangement Pitch | 51 µm | 510 µm | 10 times |
| Application Area at One Time | 70 mm × 70 mm *4-inch wafer | 1,958.4 mm × 1,101.6 mm For 88-inch panel | About 440 times |

TABLE 5

| | Source Substrate | Driving Substrate | Ratio |
|---|---|---|---|
| LED Arrangement Pitch | 48 µm | 580 µm | 12 times |
| Application Area at One Time | 70 mm × 70 mm *4-inch wafer | 2,227.2 mm × 1,252.8 mm For 100-inch panel | About 569 times |

As shown in Table 3, when a size of the driving substrate 20 is for a 32-inch panel, a ratio between arrangement pitches of the source substrate 14 and the driving substrate 20 is 3.6 times, and a ratio between areas of the source substrate 14 and the driving substrate 20 is about 57 times.

Also, as shown in Table 4, when a size of the driving substrate 20 is for an 88-inch panel, a ratio between arrangement pitches of the source substrate 14 and the driving substrate 20 is 10 times, and a ratio between areas of the source substrate 14 and the driving substrate 20 is about 440 times.

Also, as shown in FIG. 5, when a size of the driving substrate 20 is for a 100-inch panel, a ratio between arrangement pitches of the source substrate 14 and the driving substrate 20 is 12 times, and a ratio between areas of the source substrate 14 and the driving substrate 20 is about 569 times.

In this regard, it is found that the micro-LEDs 11 are arranged and adhered to the driving substrate 20 so an arrangement pitch of the micro-LEDs 11 on the driving substrate 20 may be at least 3 times an arrangement pitch of the micro-LEDs 11 on the source substrate 14. Also, as a panel size increases, a ratio of arrangement pitches increases. Also, an upper limit of an arrangement pitch on the driving substrate 20 may be any value as long as a desired number of micro-LEDs 11 may be arranged on a display panel.

Similarly, a ratio of areas may range from about 57 times to about 569 times, and as a panel size increases, a ratio of areas increases. Accordingly, the bump 31 is formed by applying the SAP 30, an application area when the SAP 30 is applied to the source substrate is less than an application area when the SAP 30 is applied the driving substrate 20.

When the source substrate 14 has a size of 70 mm×70 mm that is a 4-inch wafer size, the number of micro-LEDs held to the source substrate 14 is about 1.88 million. Accordingly, about 4.4 source substrates 14 are required at a resolution of 4 K, or about 8.3 million pixels.

Accordingly, when the SAP 30 is coated, application coated area of a required number of source substrates 14 relative to an area of the driving substrate 20 is about 1/13 in a 32-inch panel, about 1/100 in an 88-inch panel, and about 1/144 in a 100-inch panel. Accordingly, in Example Method 1, the amount of used SAP 30 may be reduced. Accordingly, manufacturing costs or costs in a coating process may be reduced. Also, because arrangement pitches of the micro-LEDs 11 are greatly different, when the SAP 30 is applied to the source substrate 14, the amount of unnecessary SAP may also be reduced.

As such, in Example Method 1, when the micro-LED 11 is transferred from the source substrate 14 to the driving substrate 20, there is a difference of 3 times or more in an arrangement pitch ratio and there is a difference of 10 times or more in an application area ratio, according to a size of a display panel. Accordingly, for example, when compared to a method of forming the adhesive layer 32 along with the bump 31 on the driving substrate 20, in Example Method 1, a manufacturing process may be simplified and a waste of materials may be reduced.

In particular, in order to manufacture the display apparatus 10 having a high resolution of 4 K or 8K which has recently been practically used, many micro-LEDs 11 have to be transferred and connected to the driving substrate 20. Accordingly, in embodiments, a manufacturing time may be reduced and productivity may be improved.

Also, in Example Method 1, because a metal for easily forming an intermetallic compound such as a solder alloy is used for the bump 31 as described above, an intermetallic compound is easily formed with metals used for the device-side electrode 12 and the driver-side electrode 21. For example, an intermetallic compound is more easily formed than an AuSn alloy or the like formed on an electrode surface by using a plating method.

Also, in Example Method 1, because the bump 31 is formed by using the SAP 30, the bump 31 may be reliably formed even on an electrode having a micro-structure.

Also in Example Method 1, because the bump 31 is formed by using the SAP 30, a process time is shorter than that of a method of forming the bump 31 by fixing a ball obtained by dissolving a front end portion of a metal wire or by performing a needle dispensing or photoresist process.

Example Method 2

Example Method 2 is different from Example Method 1 in a process of connecting the micro-LED 11 and the driving substrate 20. Other manufacturing processes are the same as those in Example Method 1. Also, elements having the same functions as those of Example Method 1 are denoted by the same reference numerals even when arrangements are different.

Figure 13:
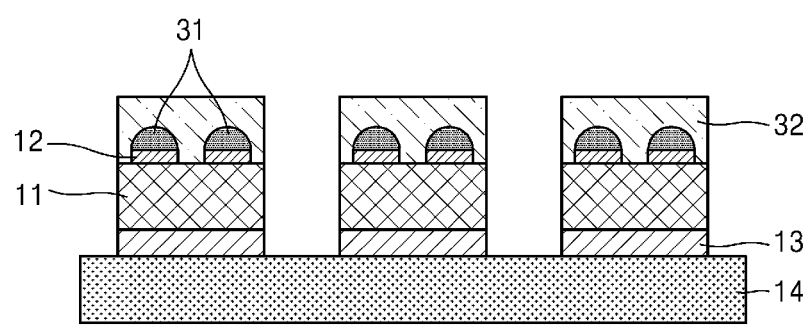
FIG. 13 is a cross-sectional view of a source substrate on which a micro-LED is held before the micro-LED is connected to a driving substrate in Example Method 2, according to an embodiment.
Figure 14:
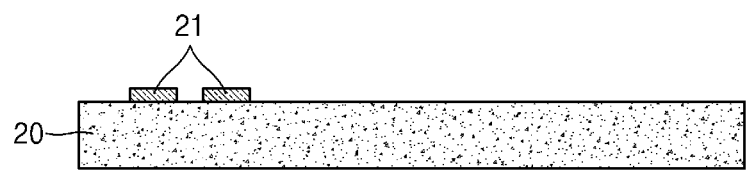
FIG. 14 is a cross-sectional view of a driving substrate before a micro-LED is connected in Example Method 2, according to an embodiment.

FIG. 13 is a cross-sectional view of the source substrate 14 on which the micro-LED 11 is held before the micro-LED 11 is connected to the driving substrate 20 in Example Method 2. FIG. 14 is a cross-sectional view of the driving substrate 20 before the micro-LED 11 is connected to the driving substrate 20 in Example Method 2.

As shown in FIG. 13, the bump 31 is formed on the device-side electrode 12 of the micro-LED 11 provided after division on the source substrate 14, and the adhesive layer 32 is formed to cover the bump 31 of each micro-LED 11. A method of forming the bump 31 and a metal material of the bump 31 are the same as those in Example Method 1. The adhesive layer 32 is formed by using, for example, a printing method, and is divided to correspond to each micro-LED 11. A thickness of the adhesive layer 32 including the bump 31 may be equal to or less than 50 µm. In embodiments, a lower limit of a thickness of the adhesive layer 32 is determined so that the adhesive layer 32 covers the bump 31. For example, when the height t of the bump 31 is equal to or greater than 2 µm and equal to or less than 20 µm like in Example Method 1, a thickness of the adhesive layer 32 may have a range equal to or greater than 3 µm and equal to or less than 21 µ.

In Example Method 2, a source substrate structure in which the adhesive layer 32 is located over the bump 31 is provided.

As shown in FIG. 14, the driver-side electrode 21 is formed on the driving substrate 20. Accordingly, in Example Method 2, the adhesive layer 32 is not formed on the driving substrate 20, unlike in Example Method 1.

Next, like in Example Method 1, positions at which the micro-LEDs 11 of the prepared source substrate 14 are to be located on the driving substrate 20 are determined, and each micro-LED 11 is transferred from the source substrate 14 to the driving substrate 20 during a laser ablation process, as shown for example in FIG. 11.

In the completed display apparatus 10, like in Example Method 1, as shown for example in FIG. 12, the device-side electrode 12 and the driver-side electrode 21 are connected to each other by the metal layer 35 and the whole or a part of the metal layer 35 is formed of an intermetallic compound. Also, portions of the micro-LED 11 and the driving substrate 20 other than electrodes are connected to each other by the adhesive layer 32.

Example Method 2 has the following effect in addition to the same effect as that of Example Method 1.

In Example Method 2, the adhesive layer 32 is formed on the micro-LED 11 of the source substrate 14. Accordingly Example Method 2 may reduce an application area of the adhesive layer 32 and may further reduce material costs when compared to Example Method 1.

As such, Example Method 2 may simplify a manufacturing process and may reduce a waste of materials, when compared to, for example, a method of forming both the bump 31 and the adhesive layer 32 on the driving substrate 20.

Example Method 3

Example Method 3 is different from Example Methods 1 and 2 in a process of connecting the micro-LED 11 and the driving substrate 20. Other processes are the same as those in Example Method 1. Also, elements having the same functions as those in Example Method 1 are denoted by the same reference numerals even when arrangements are different.

Figure 15:
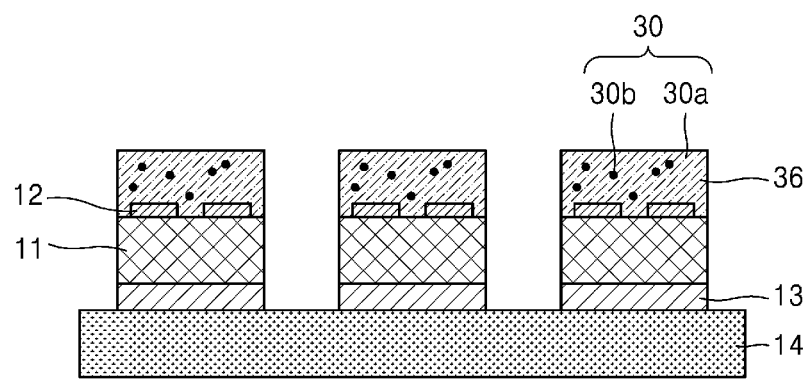
FIG. 15 is a cross-sectional view of a source substrate on which a micro-LED is held before the micro-LED is connected to a driving substrate in Example Method 3 according to an embodiment.

FIG. 15 is a cross-sectional view of the source substrate 14 on which the micro-LED 11 is held before the micro-LED 11 is connected to the driving substrate 20 in Example Method 3.

In Example Method 3 as shown in FIG. 15, the SAP 30 is applied to each divided micro-LED 11. In Example Method 3, a layer formed by coating the SAP 30 is a resin layer including the thermosetting resin 30a and the metal powder 30b mixed into the thermosetting resin 30a. In Example Method 3, the resin layer is referred to as an SAP layer 36.

The SAP 30 of Example Method 1 is used for the SAP layer 36 of Example Method 3.

The SAP layer 36 is formed only on a surface of the micro-LED 11 on which the device-side electrode 12 is provided, by using, for example, a printing method. Accordingly, the SAP layer 36 is divided to correspond to each micro-LED 11.

In embodiments a thickness of the SAP layer 36 is equal to or less than, for example, 50 µm. When a thickness of the SAP layer 36 is equal to or less than 50 µm, a thickness of the metal layer 35 described with reference to Example Method 1 may be applied.

In Example Method 3, a source substrate structure in which the SAP layer 36 is located is provided.

The adhesive layer 32 is not formed on the driving substrate 20, like in Example Method 2 as shown for example in FIG. 14.

Next, like in Example Method 1, positions at which the micro-LEDs 11 of the prepared source substrate 14 are to be located on the driving substrate 20 are determined, and each micro-LED 11 is transferred from the source substrate 14 to the driving substrate 20 during a laser ablation process as illustrated in FIG. 11. Next, in Example Method 3, in a pressing and heating process. the metal powder 30b in the SAP 30 aggregates between electrodes to form the metal layer 35 that connects the electrodes to each other.

In the completed display apparatus 10 like in Example Method 1 as shown for example in FIG. 12, the device-side electrode 12 and the driver-side electrode 21 are connected to each other by the metal layer 35, and the whole or a part of the metal layer 35 is formed of an intermetallic compound. Also, portions of the micro-LED 11 and the driving substrate 20 other than electrodes are connected to each other by the adhesive layer 32.

Example Method 3 has the following effect in addition to the same effect as that of Example Method 1.

Because the SAP layer 36 is formed by applying the SAP 30 to the source substrate 14 in Example Method 3, like in Example Method 1 or 2, the bump 31 does not need to be formed on the device-side electrode 12 on the micro-LED 11. Accordingly, Example Method 3 may simplify a manufacturing process when compared to Example Methods 1 and 2.

Also Example Method 3 may reduce a waste of SAP materials when compared to, for example, a method of applying SAP to an entire surface of the driving substrate 20.

Also, Example Method 3 may use anisotropic conductive paste (ACP) or an anisotropic conductive film (ACF), instead of the SAP 30. When the ACP or the ACF is used, the SAP layer 36 becomes an ACP layer or an ACF layer. Even when the ACP or the ACF is used, the same or similar effect as that when the SAP 30 is used is provided in Example Method 3.

Modification of Example Method 3

Figure 16:
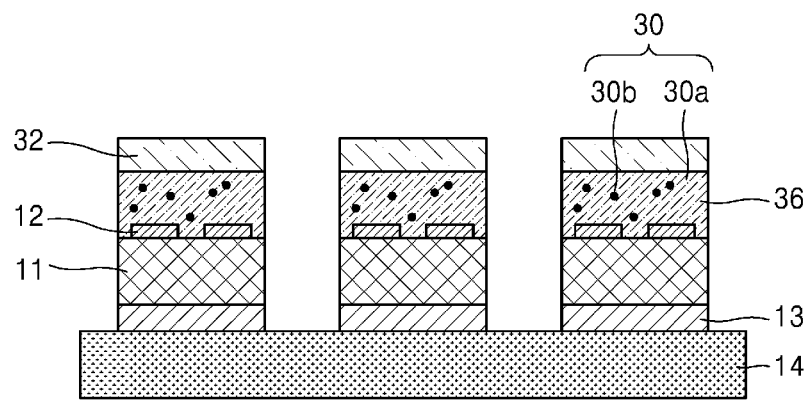
FIG. 16 is a cross-sectional view of a source substrate which a micro-LED is held before the micro-LED is connected to a driving substrate in Modification of Example Method 3, according to an embodiment.

FIG. 16 is a cross-sectional view of the source substrate 14 on which the micro-LED 11 is held before the micro-LED 11 is connected to the driving substrate 20 in Modification of Example Method 3.

In Modification of Example Method 3, the adhesive layer 32 is further provided on the SAP layer 36 of Example Method 3. The adhesive layer 32 on the SAP layer 36 is divided to correspond to each micro-LED 11, like the SAP layer 36.

Although the SAP 30 has the thermosetting resin 30a, the SAP 30 may have a small adhesive force depending on a resin component. Accordingly, depending on a resin component of the used SAP 30, the micro-LEDs 11 separated by a laser ablation process may not be caught, or may not be properly adhered, by the driving substrate 20 in some instances.

In Modification of Example Method 3, because the adhesive layer 32 is formed on the SAP layer 36, the micro-LED 11 may be caught by the driving substrate 20 at a target position in a laser ablation process, without depending on a resin component of the used SAP 30.

A total thickness of the SAP layer 36 and the adhesive layer 32 may have a range equal to or greater than 6 μm and equal to or less than 100 μm. This is to form the adhesive layer 32 on the SAP layer 36 to a thickness equal to or greater than 1 μm and equal to or less than 50 μm, when a thickness of the SAP layer 36 is equal to or greater than 5 μm and equal to or less than 50 μm. Such thicknesses may be appropriately changed.

Accordingly, in Modification of Example Method 3, a source substrate structure in which the adhesive layer 32 is provided on the SAP layer 36 is provided.

A process of connecting the micro-LED 11 and the driving substrate 20 in Modification of Example Method 3 may be the same as that in Example Method 3.

Modification of Example Method 3 may have the effect of reliably catching the micro-LED 11 by providing the adhesive layer 32, in addition to the same effect as that of Example Method 3.

Example Method 4

Example Method 4 is different from Example Methods 1 through 3 in a process of connecting the micro-LED 11 and the driving substrate 20. Other manufacturing processes are the same as those in Example Method 1. Also, elements having the same functions as those in Example Method 1 are denoted by the same reference numerals even when arrangements are different.

Figure 17:
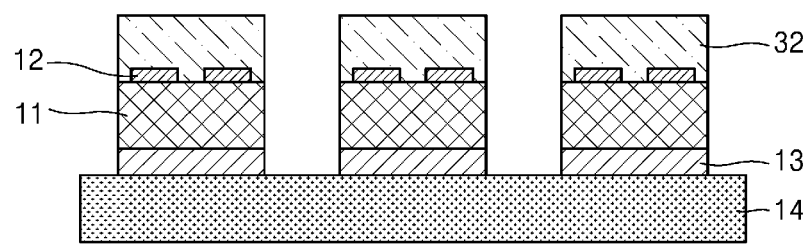
FIG. 17 is a cross-sectional view of a source substrate on which a micro-LED is held before the micro-LED is connected to a driving substrate in Example Method 4, according to an embodiment.
Figure 18:
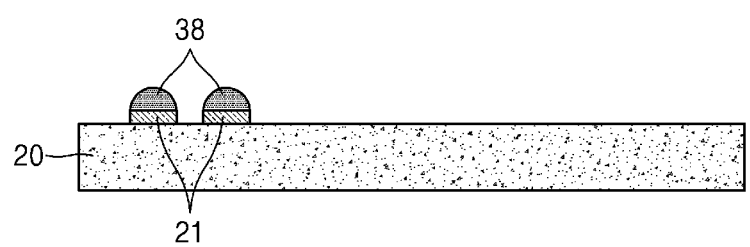
FIG. 18 is across-sectional view of a driving substrate before a micro-LEG is connected in Example Method 4, according to an embodiment.

FIG. 17 is a cross-sectional view of the source substrate 14 on which the micro-LED 11 is held before the micro-LED 11 is connected to the driving substrate 20 in Example Method 4. FIG. 18 is a cross-sectional view of the driving substrate 20 before the driving substrate 20 is connected to the micro-LED 11 in Example Method 4.

Over the source substrate 14 the adhesive layer 32 is formed on a surface of the micro-LED 11 on which the device-side electrode 12 is provided. However, the bump 31 is not formed, unlike in Example Methods 1 and 2.

The adhesive layer 32 is formed only on a surface of the micro-LED 11 on which the device-side electrode 12 is located, by using, for example, a printing method. Accordingly, the adhesive layer 32 is divided to correspond to each micro-LED 11. The same material as that of Example Method 1 is used for the adhesive layer 32.

Accordingly, in Example Method 4, a source substrate structure in which the adhesive layer 32 is located on the device-side electrode 12 is provided.

A bump 38 is formed on the driver-side electrode 21 of the driving substrate 20, as shown in FIG. 18. A method of forming the bump 38 may be the same as a method of forming a bump on the device-side electrode 12 of Example Method 1.

Accordingly, in Example Method 4, a driving substrate structure in which the bump 33 is located on the driver-side electrode 21 is provided.

Next, like in Example Method 1, positions at which the micro-LEDs 11 of the source substrate 14 are to be located on the driving substrate 20 are determined, and each micro-LED 11 is transferred from the source substrate 14 to the driving substrate 20 during a laser ablation process, as shown for example in FIG. 11).

In the completed display apparatus 10, like in Example Method 1, as shown for example in FIG. 12), the device-side electrode 12 and the driver-side electrode 21 are connected to each other by the metal layer 35, and the whole or a part of the metal layer 35 is formed of an intermetallic compound. Also, portions of the micro-LED 11 and the driving substrate 20 other than electrodes are connected to each other by the adhesive layer 32.

Example Method 4 has the following effect in addition to the same effect as that of Example Method 1.

In Example Method 4, the adhesive layer 32 is formed, on the micro-LED 11 of the source substrate 14, and the bump 31 is formed on the driving substrate 20. Accordingly, Example Method 4 may reduce an application area of the adhesive layer 32 and may reduce manufacturing costs of the adhesive layer 32 when compared to Example Method 1.

As such, Example Method 4 may simplify a manufacturing process and may reduce a waste of materials, when compared to, for example, a method of forming both the adhesive layer 32 and the bump 31 on the driving substrate 20.

EXAMPLES

Examples of the display apparatus 10 will now be described. The following examples are merely intended to illustrate various embodiments, and are not intended to limit the scope of the disclosure.

Example 1

Forming a Source Substrate

In Example 1, first, the device-side electrode 12 and a semiconductor layer 102 that is to become an LED were formed on the substrate 101 that is a sapphire substrate having a 4-inch size. The device-side electrode 12 was a gold (Au) pad directly formed on the semiconductor layer 102. A thickness of the semiconductor layer 102 was 5 μm, and the device-side electrode 12 (pad) had a rectangular shape of 60 μm×35 μm.

Next, a polyimide resin mixed with a thermal curing agent was applied by using spin coating to the relay substrate 112 to a thickness of 10 μm, to form the transfer resin layer 111. A quartz glass substrate was used as the relay substrate 112.

Next, the substrate 101 that is a sapphire substrate and the relay substrate 112 were superimposed so that the semiconductor layer 102 and the transfer resin layer 111 contacted each other, and were pressed and heated at 1000 N and 250° C. for 10 minutes to bond the substrate 101 and the relay substrate 112.

Next, KrF excimer laser having a wavelength of 248 nm was emitted from the substrate 101 that is a sapphire substrate at an energy density of 200 mJ/cm$^2$, to separate the semiconductor layer 102 from the substrate 101.

Next, a quartz glass substrate was prepared as the source substrate 14, a resin layer having a thickness of 0.15 μm was formed by spin coating a polyimide resin mixed with a thermal curing agent on the source substrate 14, and the release layer 13 was formed by firing the resin layer in a vacuum oven at 250° C. for 1 hour. A substance obtained by diluting HD3007 (HD Microsystems) to desired solid content was used as the polyimide resin. An absorbance of the HD3007 for ultraviolet light of a wavelength of 248 nm is equal to or greater than 99%.

Next, a surface of the semiconductor layer 102 on the relay substrate 112 was superimposed on the release layer 13 of the source substrate 14, and was pressed and heated by using a bonding device at 1000 N and 250° C. for 10 minutes, to bond the source substrate 14 and the relay substrate 112.

Next, KrF excimer laser having a wavelength of 248 nm was emitted from the relay substrate 112 at an energy density of 200 mJ/cm$^2$, to separate the transfer resin layer 111 from the relay substrate 112. In order to remove a transfer resin remaining on the semiconductor layer 102, N-methyl-pyrrolidone (NMP) was sprayed to a surface of the transfer resin at 60° C. for 60 seconds. Next, rinsing with pure water was performed for 60 seconds.

Next, the semiconductor layer 102 was divided into the micro-LEDs 11 by using dry etching (oxygen plasma RIE).

Formation of Bump

In order to from the bump 31, the SAP 30 was applied by using a dispenser to an entire surface of the source substrate 14 including the micro-LED 11. After the SAP 30 was applied, the SAP 30 was heated by using a hot plate to 166° C. for 1 minute, and then was cooled to room temperature. Reflow self-assembly anisotropic conductive paste Epowell AP series (Sekisui Chemical Co., Ltd.) was used as the SAP 30. A metal in the SAP 30 is a SnBi and SnAgCu solder alloy, and a resin is a thermosetting thermoplastic epoxy resin.

Next, N-methyl pyrrolidone was sprayed to a resin component the SAP 30, a solvent component was rinsed off by using isopropanol, and vacuum drying was performed under reduced pressure, Accordingly, the bump 31 having a height of 3 μm was formed on the device-side electrode 12.

Comparative Example 1

In Comparative Example 1, the bump 31 not formed on the micro-LED 11. Comparative Example 1 is the same as Example 1 except that the bump 31 is not formed.

Transfer by Laser Ablation Process

A glass substrate on which copper (Cu) comb electrodes were wired at regular intervals was prepared. The glass substrate corresponds to the driving substrate 20. The comb electrodes correspond to the driver-side electrodes 21. A size of each of the comb electrodes is 25 μm×70 μm.

The adhesive layer 32 was formed by applying a non-conductive material to an entire surface of the glass substrate including the copper comb electrode by using an applicator to a thickness of 30 μm. The non-conductive material is a thermosetting resin having a bisphenol A liquid epoxy resin as a main component.

Next, a surface of the source substrate 14 onto which the micro-LED 11 was held and a surface of the glass substrate on which the comb electrode was formed were held to face each other with a certain gap therebetween. In this case, the micro-LED 11 was transferred to the glass substrate during a laser ablation process. The source substrate 14 and the glass substrate were held so that a gap between closest portions of the source substrate 14 and the glass substrate was 100 μm. The laser ablation process was performed by using KrF excimer laser having a wavelength of 248 nm at irradiation energy of 100 mJ/cm$^2$.

Also, in Example 1, a pressing and heating process not performed after the laser ablation process for evaluation test.

Evaluation of Transfer Position Accuracy

A position of the micro-LED 11 caught in the glass substrate during the laser ablation process was measured. In order to measure the position, an interval between an edge of a target comb electrode and an edge of the micro-LED 11 was measured. The number of samples to be measured that is the number of the micro-LEDs 11 is 30 in both Example 1 and Comparative Example 1.

In Example 1 (with the bump 31), a maximum value of mismatch of measured values was ±2 μm. In Comparative Example 1 (with no bump 31), a maximum value of mismatch of measured values was ±5 μm.

It is found from a result of the evaluation of transfer position accuracy that Example 1 where the bump 31 was formed on the micro-LED 11 has less positional deviation during transfer than Comparative Example 1 where there was no bump 31.

Evaluation of Catch Performance

A glass substrate sample in which a non-conductive material having a bisphenol A liquid epoxy resin as a main component was applied as the adhesive layer 32 to a thickness of each of 5, 10, 20, and 30 μm to the glass substrate including the copper comb electrode as described above was prepared. A thermosetting resin used for the adhesive layer 32 is the same as that described above.

Like in transfer by the laser ablation process, KrF excimer laser having a wavelength of 248 nm was used, and laser light was emitted at irradiation energy of each of 50 mJ/cm$^2$, 60 mJ/cm$^2$, 70 mJ/cm$^2$, 80 mJ/cm$^2$, 90 mJ/cm$^2$, and 100 mJ/cm$^3$ for each glass substrate sample to transfer the micro-LED 11.

The transfer position accuracy was evaluated for each glass substrate sample and each irradiation energy. A result is shown in Table 6. Also, an evaluation result was obtained by evaluating the amount of deviation from a target position, and representing the amount of deviation equal to or greater than ±10 μm by using X, the amount of deviation equal to or greater than ±2 μm and equal to or less than 10 μm by using Δ, and the amount of deviation less than ±2 μm by using ○.

It is found from Table 6 that Example 1 (with the bump 31) has high position accuracy even though irradiation energy is low, when compared to Comparative Example (with no bump 31). Accordingly, it is found that an irradiation energy margin is large when the bump 31 is formed. When it comes to a thickness of a non-conductive material, even when Example 1 (with the bump 31) has a lower thickness than that of Comparative Example 1 (with no bump 31), Example 1 has less positional deviation than Comparative Example 1. Accordingly, it is found that a thickness margin during application of a non-conductive material is large when the bump 31 is formed. Also, because a film thickness of a non-conductive material may be reduced when the bump 31 is formed the amount of non-conductive material used may be reduced and costs may be reduced.

TABLE 6

| | Irradiation Energy (mJ/cm²) | | | | | |
|---|---|---|---|---|---|---|
| | 50 | 60 | 70 | 80 | 90 | 100 |
| Film Thickness 5 μm | | | | | | |
| Example 1 | X | X | Δ | Δ | ○ | ○ |
| Comparative Example 1 | X | X | X | X | Δ | Δ |
| Film Thickness 10 μm | | | | | | |
| Example 1 | X | X | Δ | ○ | ○ | ○ |
| Comparative Example 1 | X | X | X | Δ | Δ | ○ |
| Film Thickness 20 μm | | | | | | |
| Example 1 | Δ | ○ | ○ | ○ | ○ | ○ |
| Comparative Example 1 | X | X | Δ | Δ | ○ | ○ |
| Film Thickness 30 μm | | | | | | |
| Example 1 | Δ | ○ | ○ | ○ | ○ | ○ |
| Comparative Example 1 | X | X | Δ | Δ | ○ | ○ |

Example 2

In Example 2, the micro-LED 11 was formed on the source substrate 14 and the bump 31 was formed on an electrode of the micro-LED 11, like in Example 1.

In Example 2, the adhesive layer 32 was formed on the bump 31 by applying a non-conductive material having a bisphenol A liquid epoxy resin as a main component to an entire surface of the source substrate 14 by using an applicator to a thickness of 10 μm.

Transfer by Laser Ablation Process

A glass substrate on which copper (Cu) comb electrodes were wired at constant intervals was prepared. A size of each of the comb electrodes is 25 μm×70 μm.

Next, a surface of the source substrate 14 onto which the micro-LED 11 was held and a surface of the glass substrate on which the comb electrode was formed were held to face each other, and the micro-LED 11 was transferred to the glass substrate during a laser ablation process. The source substrate 14 and the glass substrate were held so that a gap between closest portions of the source substrate 14 and the glass substrate was 100 μm. The laser ablation process was performed by using KrF excimer laser having a wavelength of 248 nm at irradiation energy of 100 mJ/cm².

Also, even in Example 2, a pressing and heating process was not performed after the laser ablation process for evaluation test, like in Example 1.

Evaluation of Transfer Position Accuracy

A position of the micro-LED 11 caught by the glass substrate during the laser ablation process was measured. In order to measure the position, an interval between an edge of a target comb electrode and an edge of the micro-LED 11 was measured. The number of samples to be measured that is the number of the micro-LEDs 11 is 30 in both Example 2 and Comparative Example 1.

In Example 2 (with the bump 31), a maximum value of mismatch of measured values was ±2 μm. In Comparative Example 1 (with no bump 31), maximum value of mismatch of measured values was ±5 μm.

It is found from a result of the evaluation of transfer position accuracy that Example 2 where the bump 31 was formed on the micro-LED 11 and then the adhesive layer 32 was further applied has less positional deviation during transfer than Comparative Example 1 where there was no bump 31.

Evaluation of Catch Performance

Like in transfer by the laser ablation process, KrF excimer laser having a wavelength of 248 nm was used, and laser light was emitted at irradiation energy of each of 50, 80, 70, 80, 90, and 100 mJ/cm² for each glass substrate sample to transfer the micro-LED 11.

Transfer position accuracy was evaluated for each glass substrate sample and each irradiation energy. A result is shown in Table 7. Also, an evaluation result was obtained by representing the amount of deviation equal to or greater than ±10 μm by using X, the amount of deviation equal to or greater than ±2 μm and equal to or less than 10 μm by using Δ, and the amount of deviation less than ±2 μm by using ○, like in Table 6.

It is found from Table 7 that Example 2 (with the bump 31) has high position accuracy even though irradiation energy is low, when compared to Comparative Example 1 (with no bump 31). Accordingly, it is found that an irradiation energy margin is large when the bump 31 is formed.

TABLE 7

| Film Thickness 30 μm | | | | | | |
|---|---|---|---|---|---|---|
| | Irradiation Energy (mJ/cm2) | | | | | |
| | 50 | 60 | 70 | 80 | 90 | 100 |
| Example 2 | Δ | ○ | ○ | ○ | ○ | ○ |
| Comparative Example 1 | X | X | Δ | Δ | ○ | ○ |

As such, embodiments of the disclosure may have high transfer position accuracy of the micro-LED 11 to the driving substrate 20. Also, embodiments of the disclosure may have a large irradiation energy margin. Accordingly, it is found that a method of manufacturing the display apparatus 10 of the micro-LED 11 according to the disclosure may be simpler than that of the prior art, thereby improving yield.

Although examples and embodiments of the disclosure have been described, the disclosure is not limited thereto, and various modifications may be made.

In embodiments, a metal for easily forming an intermetallic compound is used as a metal for connecting the device-side electrode 12 and the driver-side electrode 21. However, the disclosure is not limited to a metal for easily forming an intermetallic compound. In embodiments, for example, a metal for electrically connecting the device-side electrode 12 and the driver-side electrode 21 may be used. In this case, the device-side electrode 12 and the driver-side electrode 21 are connected to each other by the metal layer 35, and the micro-LED 11 and the driving substrate 20 are connected to each other by the adhesive layer 32. Accordingly, even in this case, the micro-LED 11 and the driving substrate 20 are connected to each other by a two-layer structure including the metal layer 35 and the adhesive layer 32. A manufacturing method when a metal for easily forming an intermetallic compound is not used is the same as that in some embodiments, and thus the micro-LED 11 and the driving substrate 20 may be easily and reliably connected to each other.

According to the one or more embodiments of the disclosure, because a light-emitting, device-side electrode and a driving substrate-side electrode are connected to each other by a metal layer on which an intermetallic compound is formed, a light-emitting device and a driving substrate for driving the light-emitting device may be easily and reliably bonded to each other.

Also, according to the one or more embodiments of the disclosure, because the light-emitting device-side electrode and the driving substrate-side electrode are connected to each other by the metal layer and the light-emitting device and the driving substrate are connected to each other by an adhesive layer, the light-emitting device and the driving substrate for driving the light-emitting device may be easily and reliably bonded to each other.

The disclosure may be variously modified based on configurations described in the claims, and they fall within the scope of the disclosure.

What is claimed is:

1. A method of manufacturing a display apparatus, the method comprising:
    forming a semiconductor layer to a sapphire substrate;
    forming a device-side electrode on the semiconductor layer;
    transferring the semiconductor layer to a relay substrate by adhering the relay substrate to a surface of the device-side electrode;
    removing the sapphire substrate from the semiconductor layer;
    forming a release layer comprising a resin material on a source substrate configured to transmit laser light of a predetermined wavelength;
    transferring the semiconductor layer formed on the relay substrate to the release layer;
    removing the relay substrate;
    forming a light-emitting device by dividing the semiconductor layer;
    forming a bump on the device-side electrode; and
    emitting the laser light of the predetermined wavelength to the light-emitting device to separate the light-emitting device from the release layer and adhere the light-emitting device to a driving substrate on which a driver-side electrode is formed,
    wherein the bump formed on the device-side electrode reaches the driver-side electrode in a pressing and heating process such that the device-side electrode and the driver-side electrode are connected to each other by the bump,
    wherein a metal layer is formed between the device-side electrode and the driver-side electrode, and
    wherein the metal layer comprises at least one type of alloy from among a Sn—Ag—Cu alloy, a Sn—Bi alloy, a Sn—Bi—Ag alloy, and a Sn—Ag—Cu—Ni alloy.

2. The method of claim 1, further comprising forming an adhesive layer on the driving substrate.

3. The method of claim 1, further comprising forming an adhesive layer on the light-emitting device comprising the device-side electrode and the bump.

4. The method of claim 1, wherein the light-emitting device is included in a plurality of light-emitting devices formed by the dividing, and
    wherein the plurality of light-emitting devices are attached to the source substrate by the release layer.

5. The method of claim 1, wherein the light-emitting device has a rectangular shape,
    wherein a length of a longest side of the light-emitting device is equal to or less than 100 μm,
    wherein the light-emitting device is included in a plurality of light-emitting devices formed by the dividing, and
    wherein an arrangement pitch of the plurality of light-emitting devices on the source substrate is equal to or less than 200 μm.

6. The method of claim 1, wherein the light-emitting device is included in a plurality of light-emitting devices formed by the dividing,
    wherein a portion of the plurality of light-emitting devices are adhered to the driving substrate according to a display panel size,
    wherein an arrangement pitch of the portion of the plurality of light-emitting devices on the driving substrate is at least 3 times larger than an arrangement pitch of the plurality of light-emitting devices on the source substrate.

7. The method of claim 1, wherein each of the device-side electrode and the driver-side electrode formed on the driving substrate comprises at least one of graphene, gold (Au), silver (Ag), copper (Cu), aluminum (Al), platinum (Pt), nickel (Ni), chromium (Cr), titanium (Ti), and indium tin oxide (ITO).

8. The method of claim 1, wherein the release layer is adhered to the surface of the device-side electrode using a transfer resin layer which covers the surface of the device-side electrode, and the removing the relay substrate comprises removal of the relay substrate from the device-side electrode.

* * * * *